(12) United States Patent
Heiland

(10) Patent No.: US 8,894,052 B2
(45) Date of Patent: Nov. 25, 2014

(54) ACTIVE OSCILLATION ISOLATION SYSTEM BY MEANS OF A HYSTERESIS-FREE PNEUMATIC BEARING

(75) Inventor: Peter Heiland, Raunheim (DE)

(73) Assignee: Integrated Dynamics Engineering GmbH (DE)

( * ) Notice: Subject to any disclaimer, the term of this patent is extended or adjusted under 35 U.S.C. 154(b) by 1401 days.

(21) Appl. No.: 11/839,383

(22) Filed: Aug. 15, 2007

(65) Prior Publication Data

US 2008/0056628 A1 Mar. 6, 2008

(30) Foreign Application Priority Data

Aug. 31, 2006 (EP) .................................... 06018174

(51) Int. Cl.
F16F 15/00 (2006.01)
F16F 15/027 (2006.01)
G03F 7/20 (2006.01)

(52) U.S. Cl.
CPC ........... *F16F 15/0275* (2013.01); *F16F 15/002* (2013.01); *G03F 7/709* (2013.01)
USPC ...................... 267/140.14; 267/136

(58) Field of Classification Search
USPC ............. 267/136, 140–141.7; 355/72, 73, 76; 700/44, 45, 28, 54, 282
See application file for complete search history.

(56) References Cited

U.S. PATENT DOCUMENTS

| | | | | |
|---|---|---|---|---|
| 5,285,995 A * | 2/1994 | Gonzalez et al. | ............. | 248/550 |
| 5,605,178 A * | 2/1997 | Jennins | .................... | 137/625.65 |
| 6,094,602 A * | 7/2000 | Schade, III | ....................... | 700/45 |
| 6,144,442 A * | 11/2000 | 'T Mannetje et al. | ........... | 355/73 |
| 6,226,075 B1 * | 5/2001 | Loopstra et al. | ................. | 355/76 |
| 6,371,459 B1 * | 4/2002 | Schick et al. | .................. | 267/131 |
| 6,590,639 B1 * | 7/2003 | Yuan et al. | ....................... | 355/75 |
| 7,084,956 B2 * | 8/2006 | Dams et al. | ..................... | 355/53 |
| 2002/0120415 A1 | 8/2002 | Millott | | |
| 2005/0004689 A1 * | 1/2005 | Shih et al. | ....................... | 700/63 |
| 2007/0193263 A1 * | 8/2007 | Otaka et al. | ..................... | 60/445 |
| 2009/0153832 A1 * | 6/2009 | Tatsuzaki et al. | ............... | 355/72 |

FOREIGN PATENT DOCUMENTS

| | | |
|---|---|---|
| EP | 0814279 A1 | 12/1997 |
| JP | 5231458 A | 9/1993 |
| JP | 08075033 A | 3/1996 |
| JP | 08-312715 A | 11/1996 |
| JP | 10-256356 A | 9/1998 |
| JP | 2001-341510 A | 12/2001 |

OTHER PUBLICATIONS

Machine Translation of JP 05-231458.*
Claas Fritzen, "European Patent Application EP 06 01 8174 Search Report", Jan. 25, 2007, Publisher: EPO, Published in: EP.

(Continued)

*Primary Examiner* — Bradley King
*Assistant Examiner* — Nicholas J Lane
(74) *Attorney, Agent, or Firm* — Kaplan Breyer Schwarz & Ottesen, LLP

(57) ABSTRACT

Method and arrangement for oscillation isolation by means of an air bearing. The electropneumatic valves (4) for the compressed-air supply to the air bearing are subjected to a dither signal. This causes additional vibration of the mass 1 to be isolated. A compensation signal transmitter (12) ensures that additional vibration of the mass (1) is suppressed, by controlling actuators (10). Overall, hysteresis effects are avoided in the control of the compressed-air flow.

7 Claims, 3 Drawing Sheets

(56) References Cited

OTHER PUBLICATIONS

Y. Tokomura, "JP Patent Application No. 2007-223489 Examiner's Office Letter", Nov. 12, 20009, Published in: JP.

"Japanese Office Action for Japanese International Application No. 2007-223489", Oct. 29, 2010, Publisher: Japanese Patent Office, Published in: JP.

* cited by examiner

ACTIVE OSCILLATION ISOLATION SYSTEM BY MEANS OF A HYSTERESIS-FREE PNEUMATIC BEARING

FIELD OF THE INVENTION

The invention relates to an arrangement for oscillation isolation of a mass and to a method for oscillation isolation of the mass.

BACKGROUND OF THE INVENTION

Oscillation isolation systems such as these with pneumatic isolators are known from the prior art. For example, EP 0 927 380 B1=US 6226 075 B1 describes an air bearing which acts horizontally and vertically and which is used, for example, to support a lithographic system as the mass. Furthermore, actuators which can be driven electrically and support the mass parallel to the pneumatic isolators are used to suppress oscillations that occur.

Pneumatic bearings, also referred to as isolators, are particularly suitable for designing an oscillation isolation system because they allow the bearing stiffness to be kept very low. However, they result in a continuous leakage flow from the air bearing, which must be made good. Air bearings such as these also have the advantage that the total oscillation-isolated mass can be moved vertically, thus making it possible to move to one or more operating points. In order to allow this, the isolators have valves which can be driven electrically and use an electrical control signal to control the compressed-air flow from a compressed-air supply to the isolators, in this way allowing the air pressure in the isolators to be increased or decreased, or to be maintained at the desired level.

The compressed-air flow control for the valves according to the prior art is subject to hysteresis. This means that the same electrical drive signal does not always produce the same pressure in the pneumatic isolator. In fact, the pressure that is produced depends on the drive signal that was previously applied to the valve. The reason for this valve behavior is that the valves contain mechanical elements in order to control the compressed-air flow and these are subject to mechanical friction. The hysteresis effect results in non-linearity and this cannot be detected by simple control systems. Undesirable effects occur, therefore, during stabilization of the oscillation isolation system, since the moving mechanical element of the relevant valve must be moved repeatedly from different initial states, in particular away from the steady state.

SUMMARY OF THE INVENTION

The invention is based on the object of providing low hysteresis for oscillation isolation systems which are supplied via pneumatic valves.

For this purpose, the mechanical elements of the valves are always kept in motion, so that there is no need to have to accelerate these moving mechanical elements from the rest position.

This is done by adding an additional signal, the so-called dither signal, to the control drive signal for the valves. This "anti-hysteresis signal" has an amplitude that is as small as possible but is nevertheless sufficiently great that the moving mechanical parts of the valves are kept in motion during operation of the oscillation isolation system.

However, the dither signal produces additional undesirable fluctuations in the compressed-air flow that is supplied, and therefore pressure fluctuations in the pneumatic isolator. These pressure fluctuations in the isolator result in additional movement of the mass to be isolated, predominantly in the vertical direction and at the same frequency as the dither signal. A vibration disturbance at the dither frequency can therefore be detected from the mass.

If a dither compensation signal is now applied, in addition to the control signals for moving the oscillation-isolated mass up and down, as a compensation signal to the actuators for the oscillation isolation system, then the vibration disturbances resulting from the dither signal on the mass to be isolated are compensated for by means of the actuators.

In principle, it is also possible to carry out the control process non-adaptively. This means that a constant signal is added to the control signal for the actuators, in order to compensate for the dither signal. However, adaptive compensation for the dither signal has been found to be advantageous since the phase difference between the dither signal at the valves and the measurable effects on the mass to be supported is also variable in some circumstances, depending on the system and over time.

The mass to be supported reacts to the dither signal as a function of its isolation response. If, for example, the dither frequency is close to the natural frequency of the mass to be isolated, feeding in the dither signal causes major oscillations of the mass. The frequency of the dither signal should therefore be chosen from a frequency range in which the isolating mass, for example, an appliance to be provided with bearings which isolate it from oscillations, is particularly insensitive. The effect produced by the dither signal is admittedly then still measurable, but visible effects are minimized.

BRIEF DESCRIPTION OF THE DRAWING

One exemplary embodiment of the invention will be described with reference to the drawing, in which.

DETAILED DESCRIPTION

Figure 1:
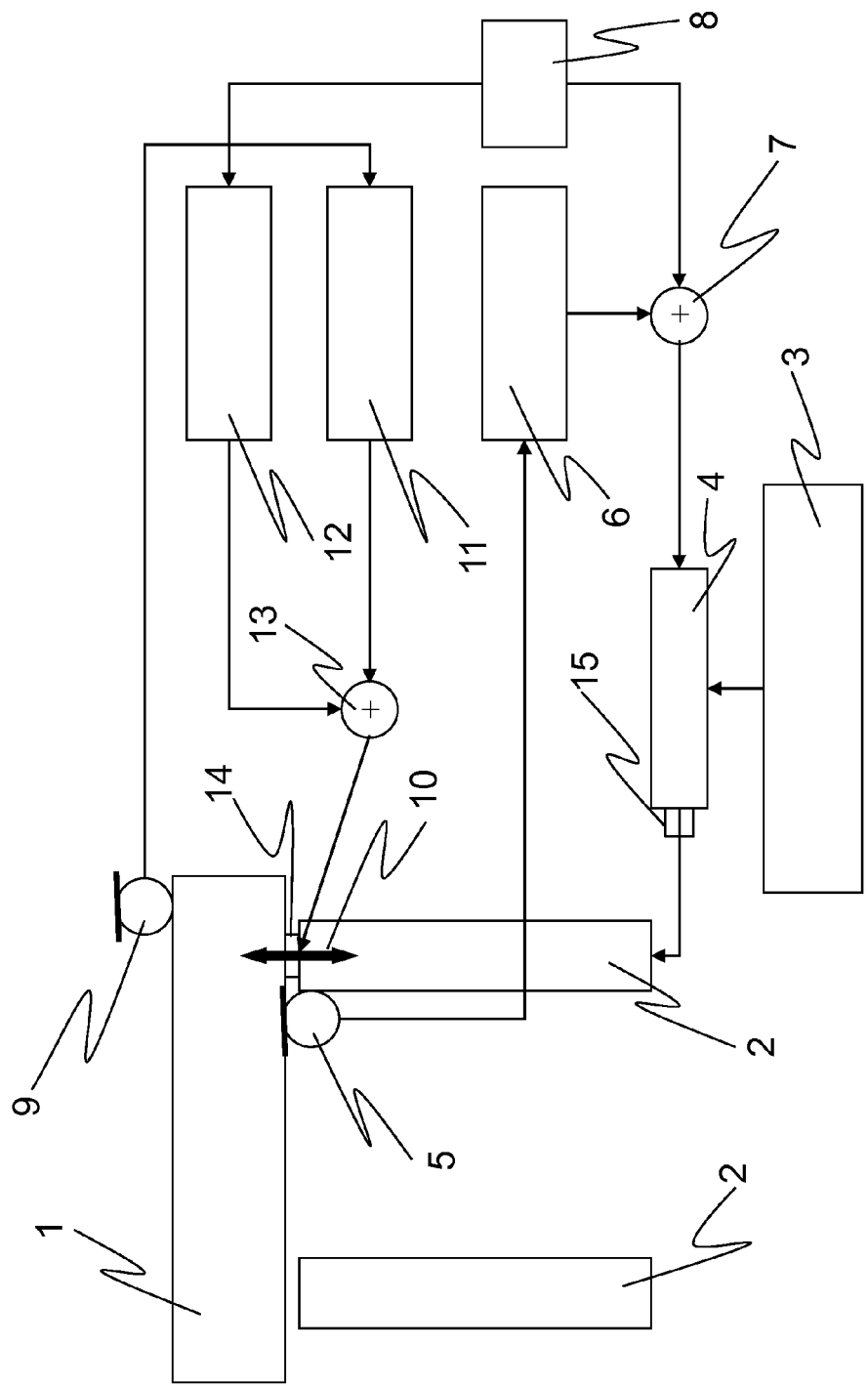
FIG. 1 shows a schematic design of the oscillation isolation system with a control system, in accordance with the non-adaptive dither compensation method of the present invention.
Figure 2:
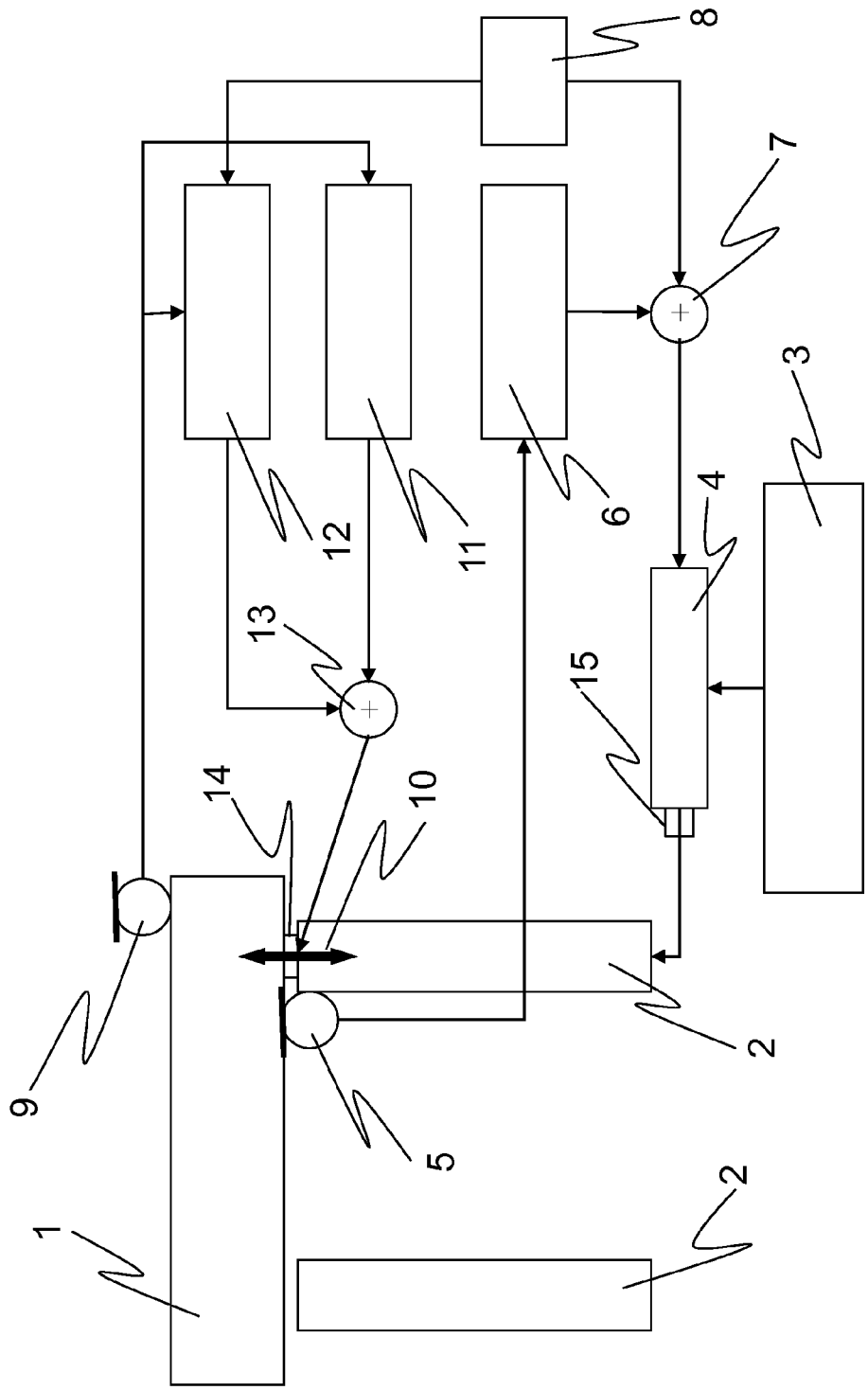
FIG. 2 shows a schematic design of the oscillation isolation system with a control system, in accordance with the adaptive dither compensation method of the present invention.
Figure 3:
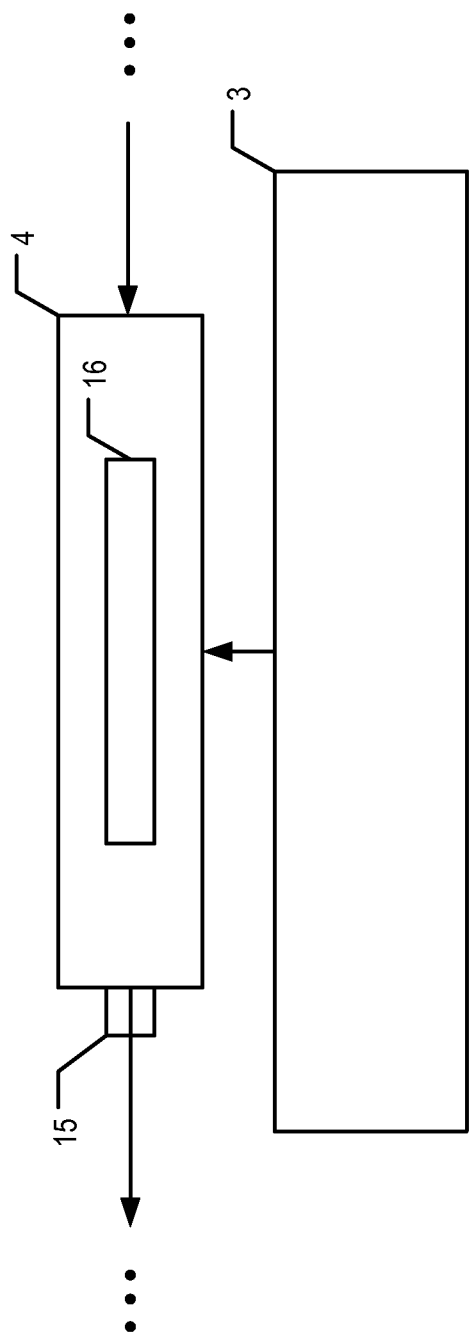
FIG. 3 shows a schematic design of a control valve, in accordance with the illustrative embodiment of the present invention.

A mass 1 is mounted on a plurality of pneumatic isolators 2 or air bearings, two of which, for supporting the mass 1 vertically, are illustrated schematically. Isolators 2 such as these are connected to a compressed-air supply which normally has a compressed-air reservoir 3, which is filled via compressors and supplies compressed air to the pneumatic isolators 2 via one or more compressed-air lines. Each of these compressed-air lines has a control valve 4 in it, in order to allow the compressed-air flow to the respective isolator 2 and the air pressure in the isolator to be controlled. The compressed-air flow can also be used to vary or adjust the supporting length of the pneumatic isolators 2. A position sensor 5 is provided in order to detect the height of the mass 1, and allows the distance between the mass 1 and a reference plane to be measured. The position sensor 5 is connected to a pneumatic control loop 6, which is in turn connected via an addition element 7 to the control valve 4. These connections normally are of an electrical nature, that is to say the position sensor 5 emits an electrical position signal to the pneumatic control loop 6 which—together with devices which will be described later—controls the control valve 4 such that the desired air pressure is achieved in the isolator and/or the desired supporting level is achieved on the mass 1.

The mass 1 is normally an appliance that is sensitive to oscillation, for example, a lithography appliance. The pneumatic isolators 2 are used to shield an appliance such as this from oscillations in the foundation. To the extent that oscillations still reach the appliance (or are produced by the latter), an active oscillation suppression system exists which contains a series of actuators 10 which are arranged between a respective isolator 2 and the mass 1. Oscillations that occur on the mass 1 are detected via movement sensors 9, and are supplied to an oscillation suppression control loop 11. The movement sensor 9 may be in the form of a distance, speed or acceleration sensor. The control loop 11 is connected via a further addition element 13 to a respective actuator 10 in order, for example, to act on the mass 1 in antiphase to the oscillations that occur.

In order to isolate foundation oscillations as well as possible from the mass 1, air bearings with a spring stiffness that is as low as possible in the horizontal and vertical directions are used as isolators 2. Inter alia, air bearings such as these have a pneumatic piston which is guided in a cylinder with a compressed-air leakage flow escaping between the cylinder and the piston. For this reason, compressed air must be supplied continuously to the isolator 2 in order to compensate for the pressure loss, and this is done by means of the control valve 4. A control valve 4 such as this has a moving mechanical valve element which interacts with stationary valve walls in order to vary an aperture opening for the compressed air, thus controlling it. The moving valve element is moved by the electromotive force of the control valve 4, the drive signal being supplied from the control loop 6. However, the moving valve element is subject to mechanical friction. In practice, the desired final position of the moving valve element cannot be reached by the applied drive signal in one go. This therefore results in so-called hysteresis in the control of the compressed-air flow. The magnitude of the hysteresis depends inter alia and additionally on the drive signal previously applied to the control valve 4. Hysteresis is a non-linear effect which cannot be detected by simple control systems and therefore cannot easily be overcome.

As is known, friction occurs in the form of static friction and sliding friction, with the latter being considerably less than the former. One fundamental idea of the invention is to preclude static friction in the moving valve element. The moving valve element of the control valve 4 is therefore kept in continuous motion. For this purpose, a dither signal transmitter 8 is provided and is connected to the addition element 7 in order to supply the moving valve element with a dither signal which ensures that the moving valve element carries out a continuous dither movement. This avoids the electrical drive signals for the pneumatic control loop 6 having to overcome the static friction of the moving valve element. Overall, this results in the hysteresis of the control process being reduced.

A sinusoidal signal at an adjustable, but then fixed, frequency is preferably used as the dither signal. The frequency of the dither signal is considerably higher than the frequency bandwidth of the normal control signal. The frequency bandwidth for a pneumatic control system is in the range from 0 to a maximum of 20 Hz, while the frequency of the dither signal is in the range from 35 to 100 Hz.

However, the dither movement of the moving valve element also leads to pressure fluctuations in the pneumatic isolator 2, and thus to an oscillation influence on the mass 1. This influence can be detected by means of the movement sensor 9. The invention is therefore also aimed at suppressing the dither oscillations that occur on the mass 1. A dither compensation circuit 12 is provided, whose input side is connected to the movement sensor 9 and to the dither signal transmitter 8, and whose output side is connected to the addition element 13. The dither compensation circuit 12 compares the oscillations occurring on the mass 1 with the signal from the dither circuit 8, and uses this to obtain a dither compensation signal, which is supplied to the actuator means 10. This counteracts the dither oscillations resulting from the dither pressure fluctuations in the isolator 2, essentially overcoming the effects of these oscillations on the mass 1.

The method of operation of the oscillation isolation system will be described in the following text. It is assumed that the mass 1 to be isolated is intended to be moved vertically to a specific level, for example, in order to reach one or more operating points. For this purpose the position sensor 5 measures the distance between the mass 1 to be isolated and the associated isolator 2. The measurement result is passed to the pneumatic control loop 6, which sends drive signals to the control valve 4 via the first addition element 7 in order to vary the vertical position of the mass 1. The opening width of the control valve 4 is varied as a function of the drive signals, so that more or less compressed air flows out of the compressed-air reservoir 3 into the isolator 2. If the pressure in the isolators 2 is increased as a result of the compressed-air flow being increased, then the mass 1 to be borne moves upward. When the pressure in the isolators 2 is reduced, the mass 1 to be isolated moves downward.

Oscillation isolation is provided for the mass 1 by using the movement sensor 9 to continuously measure the oscillation state of the mass 1 to be isolated. The measurement results from the movement sensor 9 are transmitted to the oscillation suppression control loop 11. Depending on the measurement results obtained, the control loop 11 sends signals to the actuators 10, which move the mass 1 such that, overall, this compensates for the oscillations transmitted to the mass 1, so that, overall, the mass 1 is stationary relative to the foundation, or is moved uniformly with respect to it.

The dither signal is passed continuously from the dither signal transmitter 8 to the first addition element 7 and to the control valve 4 so that the sum of the "normal" signal from the pneumatic control loop 6 and the dither signal from the signal transmitter 8 arrives at the control valve 4.

The dither vibration of the valve element of the control valve 4 and therefore of the isolators 2, resulting from this, is transmitted to the mass 1 to be isolated. This vibration of the mass 1 is measured by the movement sensor 9. The measurement result from the movement sensor 9 is passed to the oscillation suppression control loop 11. The dither compensation circuit 12 also receives the dither signal from the dither signal transmitter 8 (non-adaptive dither compensation method).

The oscillation suppression control loop 11 and the dither compensation circuit 12 each pass signals to the second addition element 13, which passes the sum of the two signals to the actuators 10. These actuators 10 are represented by motors which vary the changing distance between the mass 1 and the isolators 2 resulting from vibration, mainly in the vertical direction, such that the vibration caused by the dither signal on the mass 1 is compensated for.

It is also possible to additionally pass the measurement result from the movement sensor 9 to the dither compensation circuit 12. In this case, the dither compensation circuit 12 uses the dither signal and the measurement results from the movement sensor 9 to calculate a dither compensation signal, which is passed to the second addition element 13. The difference from the already described non-adaptive method is that the dither correction signal depends on the respective oscillation state of the mass 1, so that the dither vibration that occurs can be compensated for better (adaptive method for dither compensation).

When the height of the mass 1 is varied in the already described manner, for example, in order to reach one or more operating points, then the difference between the nominal height and the actual height of the mass 1 is determined by means of the measurement results from the position sensor 5. When the mass 1 approaches the predetermined nominal height, then this difference tends to zero. In practice, a so-called control fluctuation around the nominal value, in this case the nominal height, occurs in control processes. Since the dither signal that is additionally fed in has an amplitude which is just sufficient to keep the moving valve element in motion, the air bearing 2 oscillates with a small amplitude about the nominal value, that is to say it results in a control fluctuation whose pattern is, however, known precisely. It is therefore possible to largely preclude this control fluctuation at the target object, the mass 1. Overall, therefore, this results in better, more accurate positioning of the mass 1 than would be possible without the use of the dither compensation signal.

The invention claimed is:

1. An arrangement for oscillation isolation of a mass comprising:
    an air bearing for supporting the mass, wherein the mass comprises a lithographic system;
    a device for supplying pressure to the air bearing, the device having a compressed-air source and a control valve for a compressed-air flow to be supplied to the air bearing;
    a pneumatic control loop for controlling a moving valve element of the control valve;
    an actuator for oscillation-suppressing support of the mass;
    a sensor for detecting the oscillation state of the mass;
    an oscillation suppression control loop for controlling the actuator as a function of the sensor; and
    a dither signal transmitter for transmitting a dither signal to both:
        i) the control valve, in order to influence the movement state of the valve element, resulting in dither vibration of the mass being produced, and
        ii) a dither compensation circuit;
    wherein the dither compensation circuit is for controlling, based on the dither signal from the dither signal transmitter, the actuator, in order to suppress the dither vibration of the mass,
    wherein the dither compensation circuit and the oscillation suppression control loop are connected to the sensor for detecting the oscillation state of the mass, and
    wherein the dither compensation circuit and the oscillation suppression control loop are connected via an addition element to the actuator for oscillation-suppressing support of the mass.

2. The arrangement for oscillation isolation as claimed in claim 1, wherein the pneumatic control loop can be operated with control fluctuations about a respective predetermined nominal value, with the control fluctuations being predetermined externally by the dither signal.

3. The arrangement for oscillation isolation as claimed in claim 1, wherein the pneumatic control loop has a first addition element via which the dither signal transmitter is connected to the control valve.

4. The arrangement for oscillation isolation as claimed in claim 1, wherein the pneumatic control loop has a position sensor.

5. The arrangement for oscillation isolation as claimed in claim 1, wherein the output side of the dither signal transmitter is connected to an input of the dither compensation circuit.

6. The arrangement for oscillation isolation as claimed in claim 1, wherein the dither signal transmitter is a sinusoidal signal transmitter.

7. The arrangement for oscillation isolation as claimed in claim 6, wherein the frequency of the dither signal is between 35 and 100 Hz.

* * * * *